United States Patent [19]
Genty et al.

[11] 4,405,865
[45] Sep. 20, 1983

[54] DEVICE FOR ADJUSTING THE POSITION AND THE ORIENTATION AROUND AN AXIS OF A SAMPLE HOLDER FOR AN ELECTRON MICROSCOPE

[75] Inventors: Bernard Genty, Versailles; Alain Marraud, Villebon; Roger Valle, Clamart, all of France

[73] Assignee: Office National d'Etudes et de Recherches Aerospatiales, France

[21] Appl. No.: 296,549

[22] Filed: Aug. 26, 1981

[30] Foreign Application Priority Data

Aug. 29, 1980 [FR] France ................. 80 18836

[51] Int. Cl.$^3$ ............................................. H01J 37/20
[52] U.S. Cl. ................................................. 250/442.1
[58] Field of Search ........................ 250/440.1, 442.1

[56] References Cited
U.S. PATENT DOCUMENTS 2,910,590 10/1954 van Dorsten et al. ........... 250/440.1
4,101,778 6/1978 von Rauch et al. ............. 250/442.1

OTHER PUBLICATIONS

"Goniometer Stage for Electron Microscopes", Philips.

Primary Examiner—Alfred E. Smith
Assistant Examiner—Jack I. Berman
Attorney, Agent, or Firm—Larson and Taylor

[57] ABSTRACT

The device includes a support tube passing through the wall of the column of the microscope, whose inner end is supported on an inner structure of the microscope by a hemispherical surface. This is supported in the wall around the orientation axis and is connected to the sample-holder which it traverses by control means enabling the position of the sample-holder to be adjusted in the support tube along three axes of a reference dihedral. The control means comprise an annular diaphragm for suspending the sample-holder in the support tube close to the center of the support surface. Lever and push-rod connecting linkages of high stiffness enable the sample-holder to be tilted around the center of the diagram in two perpendicular planes.

7 Claims, 5 Drawing Figures

DEVICE FOR ADJUSTING THE POSITION AND THE ORIENTATION AROUND AN AXIS OF A SAMPLE HOLDER FOR AN ELECTRON MICROSCOPE

BACKGROUND OF THE INVENTION

The present invention relates to a device for adjusting the position and the orientation around an axis of a sample holder for an electron microscope. It finds a particularly important application in very high voltage electron microscopes, of 1 MeV and higher.

It is known that electron microscopes are particularly used for studies which require the possibility of adjusting not only the position of the sample in a plane (to select the point observed) and in height, but also its inclination. Devices permitting these functions to be carried out are called "goniometric plate" devices.

The variations in inclination of the sample holder must not to be manifested either by movement of the sample in its plane, which would lead to a change in the zone observed, nor by a vertical movement which would necessitate refocusing, which operation would result in its turn in a change in magnification and, if the microscope is a magnetic optical microscope, a rotation of the image.

To avoid any interaction of the inclination movement with the translation movements, the axis of inclination must remain concurrent with the electron beam which determines the zone observed. A device corresponding to this condition is called a "eucentric goniometric plate" device. To constitute this, it is necessary in particular for the controls of translation movement to be borne by a unit of the device which can be inclined as a block.

The majority of existing eucentric goniometric plate devices for an electron microscope with lateral entry are of the type comprising a support tube passing through the wall of the column of the microscope, whose inner end is supported on an internal structure of the microscope by a hemispherical surface, which is supported in the wall of the column by means permitting it to rotate around the axis of orientation, and which is connected to the sample holder which passes through it, by control means enabling adjustment of the position of the sample holder in the support tube along the three axes of a reference trihedral.

The sensitivity and the resolution which can be achieved by currently known devices of this type are relatively satisfactory in conventional electron microscopes of 100 and 200 KV. This is not the case for high voltage microscopes due to the fact in particular of the increase in diameter of the column, which reaches 500 mm from a voltage of 1 MV, instead of about 200 mm at 200 KV. In fact, these devices have overhangs such that the deformations in flexion become notable and weights such that the solid friction to be overcome is manifested by jerky movements.

It is an object of the present invention to provide a device of the above-defined type avoiding appreciable deformations and frictions of guidance and articulation which cause jerky movements detrimental to sensitivity and permitting the sample to be made fast with the column, any relative movement between the sample and the column limiting the overall resolution of the microscope.

GENERAL DESCRIPTION OF THE INVENTION

Accordingly, the invention provides a device in which the actuating means comprise an annular suspending diaphragm for the sample holder in the support tube, close to the center of the support surface and lever rod systems, and a connecting push rod of great stiffness permitting the sample holder to be tilted around the center of the diaphragm in two perpendicular planes. These rod system include frictional members exerting a predetermined friction enabling the assembly of the tube and the sample holder to be made fast to the column as regards low frequency vibration.

The mounting means enabling the support tube to rotate comprise advantageously a ball-bearing sleeve placed around the support tube, advantageously in the vicinity of the center of gravity of the assembly inclinable as a block. This sleeve can be supported by an annular elastic diaphragm for connection with the column, of large size and of high radial stiffness.

In such a device, the assembly inclinable as a block rotates around an axis defined by the connecting diaphragm and the sleeve and by the center of the hemispherical surface, which axis remains perfectly defined even if the support tube is not rectilinear between the sleeve and the hemispherical surface.

It is seen besides that it is the sleeve, whose coefficient of friction is much lower than that of the support, which supports almost the whole of the weight of the inclinable assembly. The hemispherical support is only subjected to the force due to atmospheric pressure exerted on a small surface area and which can be counter-balanced by a spring.

The invention will be better understood on reading the description which follows of a particular embodiment, given by way of non-limiting example, and from the comparison which is made with a device according to the prior art.

BRIEF DESCRIPTION OF THE DRAWINGS

The description refers to the accompanying drawings, in which.

In order to make the invention better understandable, the constitution and operation of a device according to the prior art will first be recalled.

PRIOR ART DEVICES

Figure 1:
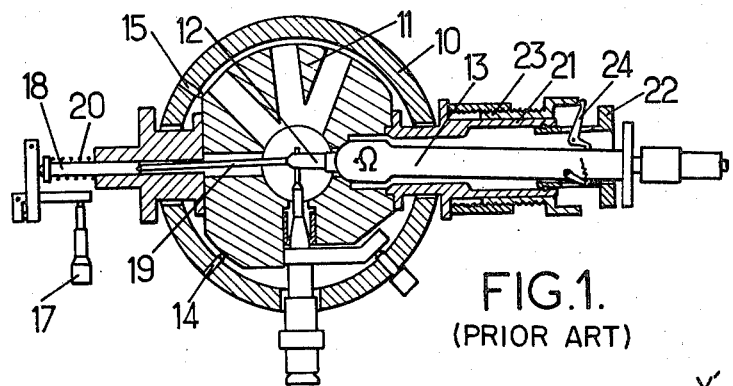
FIG. 1 is a simplified plan view of a device according to the prior art.
Figure 2A:
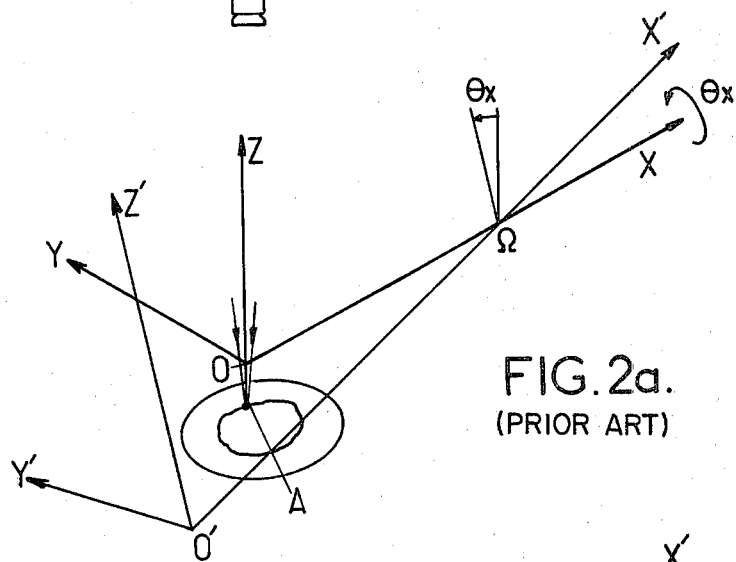
FIGS. 2a and 2b show diagrammatically the kinematics of the device of FIG. 1.
Figure 2B:
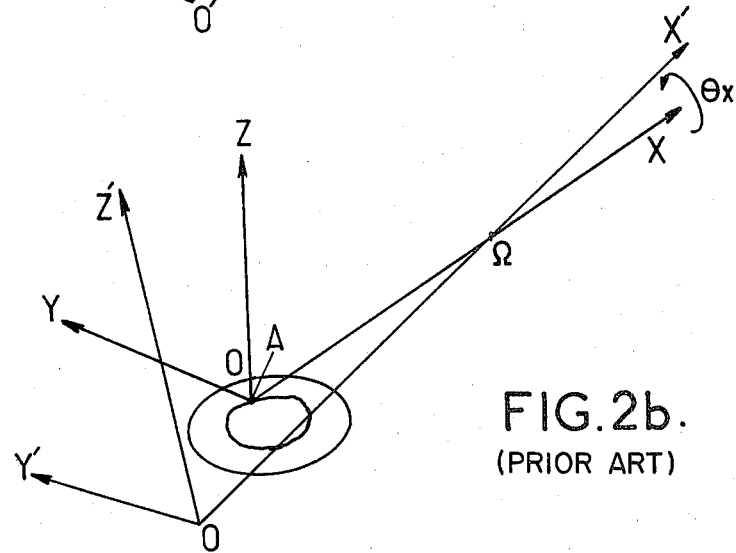

The eucentric plate device of FIG. 1, whose system kinematics is shown diagrammatically in FIGS. 2a and 2b, is mounted in a microscope of which the column 10 (FIG. 1) is provided with a lateral input, situated opposite an inner structure 11 whose position in the plane is adjustable. This device comprises a sample holder 12 which passes through a tubesheath 13 provided with a lock enabling the introduction and withdrawal of a sample without breaking the vaccuum which exists in the microscope column. The inner end of the sheath 13 is hemispherical in shape and cooperates with a corresponding support surface of the structure 11 to constitute a ball-joint articulation whose center Ω is close to the optical axis O. The structure 11, independent of the pole pieces, is provided with adjustable stops 14 and 15 permitting its position to be adjusted. It carries a sleeve 21 which surrounds the sheath and in which a tube 22 fast in rotation with the sheath 13 rotates.

FIGS. 2a and 2b show the movements which the device of FIG. 1 permit. In these figures, are shown:

the trihedral OXYZ connected to the structure of the microscope, and the trihedral O'X'Y'Z' connected to the sample holder 12.

The point O represents the point of intersection of the axis of the electron beam and the axis of inclination OX. The device must permit the sample to be given:

a longitudinal movement parallel to the axis X' and a transverse movement parallel to the axis Y', both parallel to the plane of the object;

a movement of height adjustment along Z' enabling the point A to be observed to be brought onto the inclination axis OX, for example by a movement of amplitude z' from the position of FIG. 2a to that of FIG. 2b;

and an angular movement for adjusting the inclination $\theta_x$ around OX.

It will be seen that, in the device of FIG. 1, all the movements of the sample, except along OX, are effected by rotation of the sheath 13 around the center Ω of the ball-joint. However, the translation movements of a point of the sample can be assimilated to straight lines since the angles of rotation are small and the lever arms large.

More precisely, the movements are effected in the following manner:

The movements along O'X' are actuated by a micrometer screw 17, through levers, a push-rod 18 and a transmission rod 19 against the action of a return spring 20. The atmospheric pressure holds the sample holder 12 in contact with the rod 19.

The transverse movements along O'Y' are actuated by a bush 23 screwed onto the sleeve 21 and coupled to the sheath 13 by an angle lever 24.

The movements along O'Z' are actuated by a micrometer screw (not shown) working against the action of a return spring.

Finally, the inclination $\theta_x$ is adjusted by the rotation of the tube 22, in a ball-bearing borne by the sleeve 21.

As has been indicated above, such a device is only satisfactory if the diameter of the column remains small. When it reaches several tens of centimeters, one runs up against numerous difficulties: the sample holder 12 includes a rod or stick supported at its center to be slideable along OX' and whose bending deflection can reach 0.1 mm. The solid frictional forces opposed, for example, by the ball-joint to the movements reach several Newtons if the mass of this assembly reaches some kg and thus cause jerky movements.

The device according to the invention which will now be described does not include any of the above defects.

DESCRIPTION OF A PREFERRED EMBODIMENT

Figure 3:
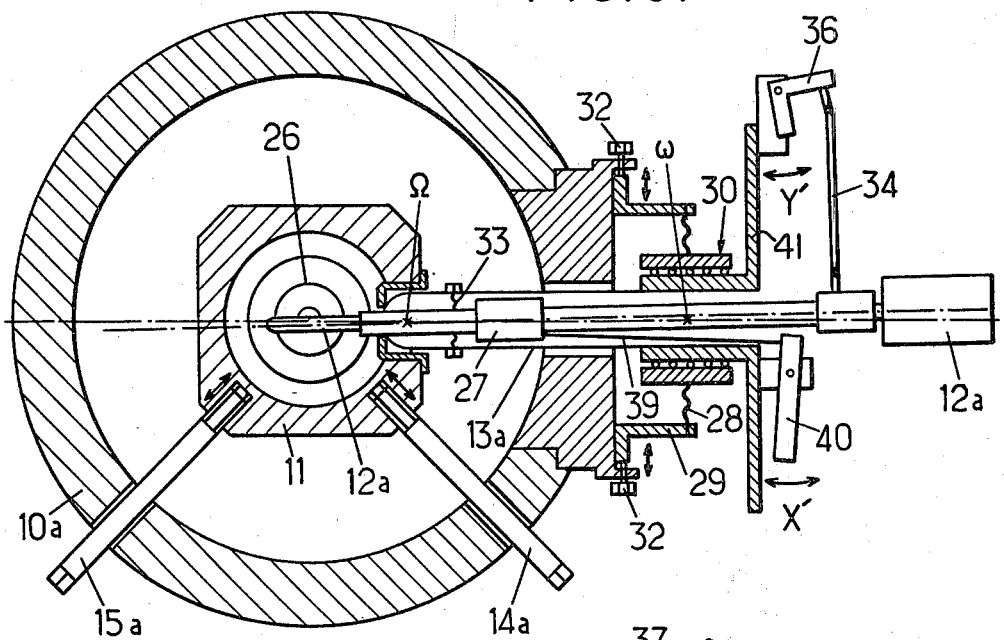
FIG. 3, similar to FIG. 1, is a simplified plan view of an embodiment of a device according to the invention.
Figure 4:
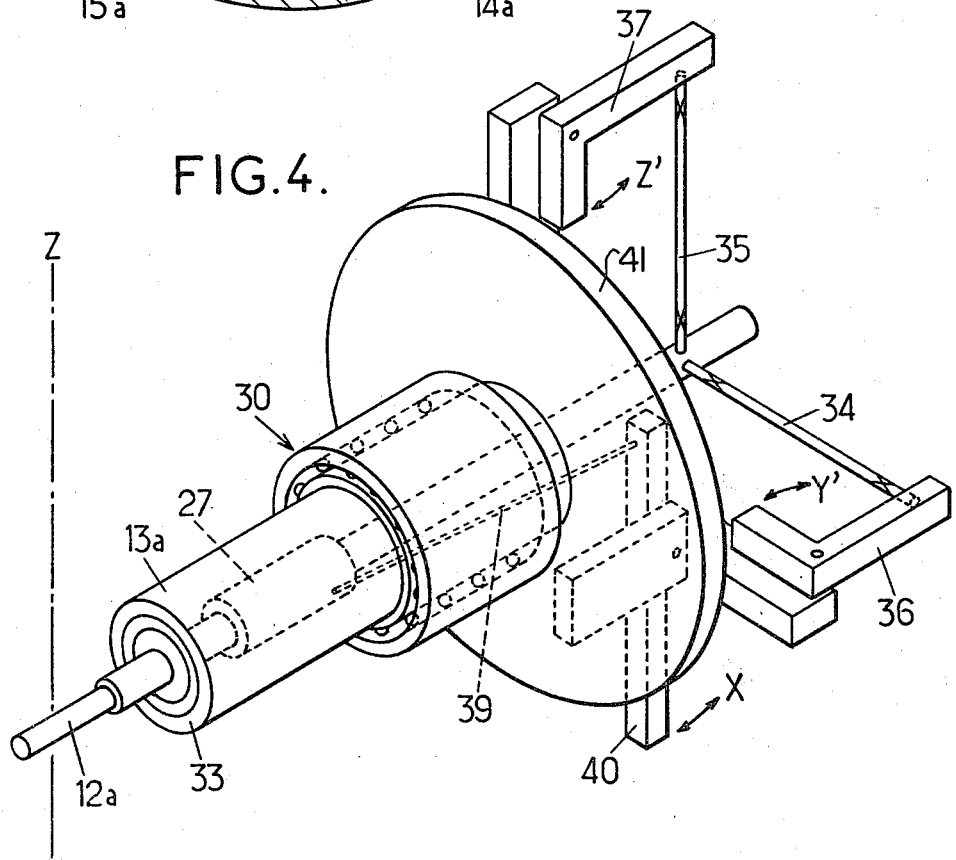
FIG. 4 is a simplified perspective view of the device of FIG. 3.
Figure 5:
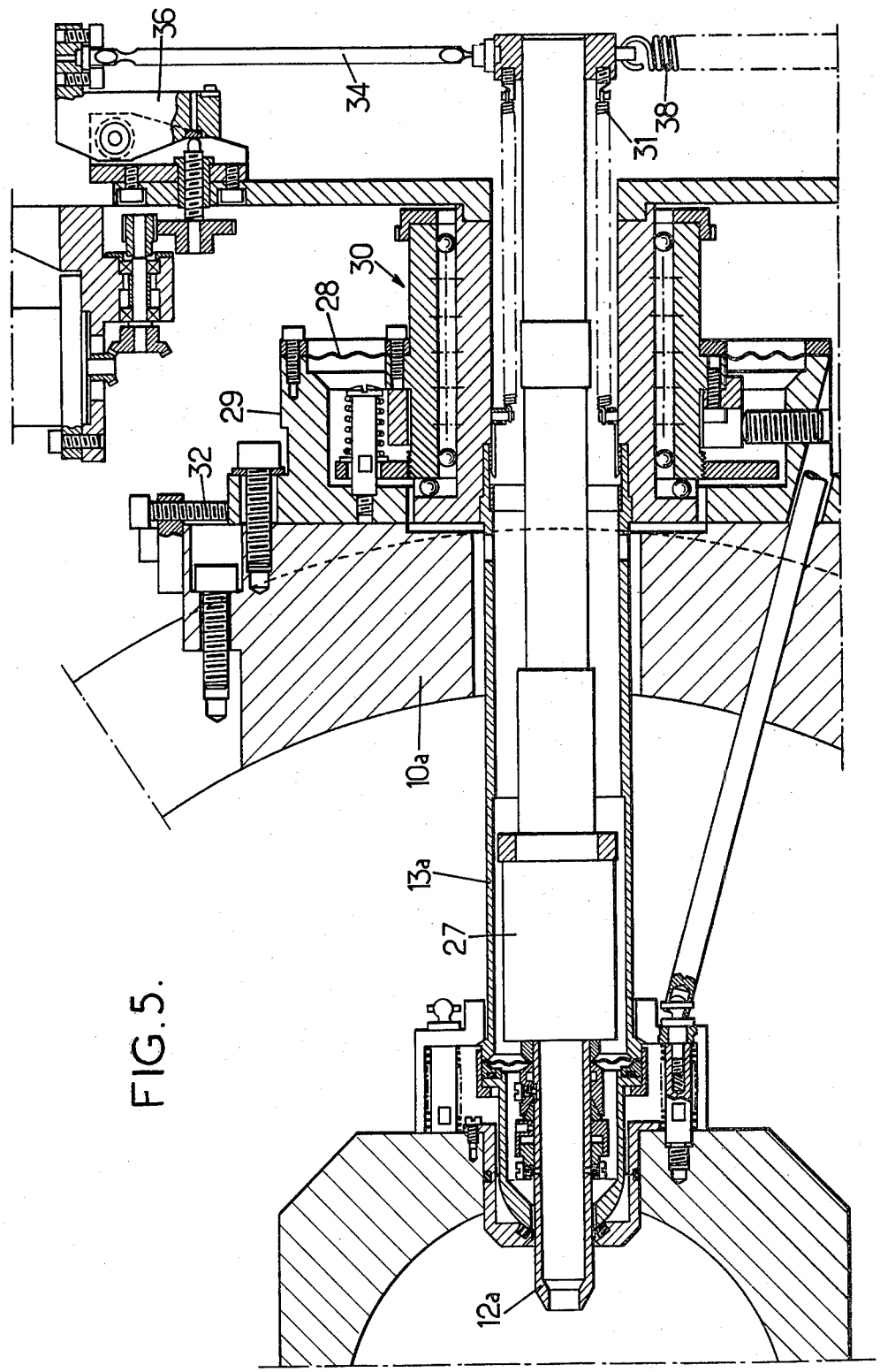
FIG. 5 is a partial view on a large scale, in plan view of a device according to the diagram of FIG. 3.

The device shown in FIGS. 3 to 5 wherein members corresponding to those of FIG. 1 are denoted by the same reference numerals, modified by the index a, is provided to move a sample holder 12a in the connecting cross-bar 11a of the pole parts 26 of the microscope.

The sample holder passes through a support tube 13a provided with a lock 27 and whose hemispherical inner end is supported on a corresponding support surface fast to the structure 11a to constitute a ball-joint.

The device is provided to:

carry out the inclination movement as in the device of FIG. 1 but with low frictional forces in spite of the considerable weight of the rotary assembly;

carry out on the contrary transverse movements (at Y') and in height (along Z') without bringing the ball-joint into play, hence avoiding solid friction of which it would be the site.

The first result is achieved by causing the support tube 13a to be supported by a bearing connected in turn to a part 29 fast to the column through a diaphragm 28 of high radial stiffness, perpendicular to the axis OX and whose center ω is situated in the vicinity of the center of gravity of the assembly moveable in rotation. The bearing must have a very low coefficient of friction: advantageously a ball-bearing sleeve 30 is used whose coefficient of friction is in the order of 0.001. The ball-bearings of the sleeve 30 being mounted under stress, the rotary movement does not have any play.

The ball-bearing sleeve 30 framing the center of gravity of the assembly moveable in rotation supports the whole weight. The frictional forces in the ball-joint, whose coefficient of friction is much higher (about 0.1), are only due to the atmospheric pressure exerted on a small effective surface (about 3 cm$^2$) and tending to be applied to the end of the tube 13a on its support. This frictional force can be adjusted by the action of springs such as those shown at 31 in FIG. 5.

The inclination is modified by rotating the rotary unit as a block. It is seen that in the course of this rotation, the assembly is centered on the one hand on the column 10a through the connecting diaphragm 28, on the other hand on the cross-bar 11a by the ball-joint. The axis of the sample holder is hence defined by the center ω of the ball-joint and the point of intersection Ω of the plane of the diaphragm 28 by the axis of the ball-bearing sleeve. This axis remains perfectly defined even if the connecting tube between the inner ring of the ball bearing 30 and the hemispherical end is not quite straight.

The elastic connecting diaphragm 28 and the hemispherical bearing enable the axis of inclination to be adjusted and to be brought to cut the electron beam. This adjustment is obtained by moving the support piece 29 of the diaphragm, by means of two screws 32, on the column 10a of the microscope. This diaphragm-balljoint assembly also permits the movement of the cross-bar bearing the pole parts, on alignment of the microscope.

The second result is achieved particularly by permitting the movements at X, Y' and Z' by the deformation of one and the same elastic suspending diaphragm 33. This diaphragm plays both the part of an elastic deformation universal joint permitting movements along Y' and Z' and that of an elastic diaphragm proper, permitting the longitudinal movement along X. The diaphragm 33 has the advantage of great radial rigidity ensuring stability of centering associated with sufficient flexibility to permit the inclination and the longitudinal movement. Moreover, this diaphragm 33 produces fluid tightness between the chamber occupied by the sample, wherein a high vacuum exists, and the outside. The movements along Y' and Z' of the sample are applied to the lock tube bearing the sample holder rod through long articulated rods 34, 35 from angle levers 36, 37 similar to the lever 24 of FIG. 1. However these rods are articulated on cardans with elastic deformation machined directly in the terminal portions of the rods. The rods act against the effect of springs such as 38 which avoid any lost motion.

The longitudinal movements can be actuated similarly by a stiff rod 39 and lever 40.

In counterpart to its simplicity, the device does not produce the desired movements strictly geometrically. The longitudinal movement is oriented along the axis X and not along X′ due to the fact that, by reason of symmetry, the center of the diaphragm 33 is moved along OX under the effect of the rod 39, and not in the general plane of the sample which is parallel to the axis O′X′ of the sample holder. However the angle between the axes OX and OX′ is less than a degree, also this coupling is manifested by a variation $\Delta Z'$ of some micrometers for a movement of the sample $\pm 1$ mm along the axis OX, which variation remains small in comparison with the irregularities of the sample surface.

A slight coupling exists between the movements at X, Y′ and Z′ due to the fact that the rods 34, 35 and 39 have a finite length.

Since the actuating rod 35 of the movement at Z′ is of finite length, the end of the sample holder describes a circular movement. However the resulting coupling is practically negligible.

It is seen that the small amplitude of the movements enables an original design to be reached unexpectedly and of extreme simplicity which is sufficiently approximate for the linear movements and completely strict for the inclination $\theta_x$. The device is hence entirely eucentric for each point of the sample.

To pass from one point to the other of the sample the adjustment in height Z′ must be regulated to bring the point concerned to the point of intersection of the axis of inclination and of the beam. However, even with a geometrically perfect plate, a particular adjustment would have to be carried out for each point, since the actual samples are never perfectly flat. The practical use of a prototype, on a microscope of 1 MV, has permitted it to be shown that the geometric simplicity of the plate did not at all interfere with its utilization.

The lock tube-sample holder-diaphragm assembly behaves like a suspended mass, such as a seismograph, whose own frequencies are sufficiently low for the sample not to follow the inevitable vibrations of the column at frequencies which can reach 40 to 50 Hz. The effect of vibration is then limited by making sufficiently fast the sample holder to the column of the microscope, by means of a suitable constitution of the elastic connecting parts and by the introduction of solid or "dry" friction into the transmissions, sufficiently weak not to introduce jerks.

In the typical case where it is necessary to ensure oscillations as a unit of the sample and the column up to a frequency of the order of 200 Hz, the following measurements would be taken:

all the parts whose stiffness can be selected at will are given a structure such that their resonant frequency reaches 200 Hz. This is particularly the case of the elastic rods 34, 35 and 39, designed so as to produce a compromise between the flexibility necessary without plastic deformation, and the diaphragms as regards radial deformations;

the impossibility of fulfilling this condition in the case of the diaphragm 33 whose axial stiffness must be weak is offset by introducing a slight solid frictional force into the transmission.

The latter result is achieved for example by mounting levers 35, 36 and 40 on the plate 41, fast to the support tube 13a, by thin pads of filled "teflon", introducing a slight solid frictional force between the levers and their axes which are fast to the plate. The radial stiffness of the diaphragm 28 connecting the outer ring of the bearing 30 to the column 10a of the microscope, is sufficient to make fast the movable mechanism on inclination of the column in the radial direction; in the axial direction, the frictional forces of the hemispherical balljoint eliminate any relative movement.

The solid friction necessary is very low: to make fast a mass of 10 kg with a support vibrating with an acceleration of $10^{-4}$ g, it suffices to have a solid frictional force slightly greater than $10^{-2}$ N. The introduction of so low a frictional force does not destroy the sensitivity of the system and renders the use of elastic connections compatible with the need to limit the relative movement sample-microscope column to less than one nanometer.

It is seen that the invention enables a simple device to be produced constituting a eucentric goniometric plate, capable of being applied to any type of electron microscope with lateral input and devoid of defects limiting its resolution.

We claim:

1. In an electron microscope having a column and an internal structure, a device for adjusting the location and angular position of a specimen holder, comprising:
   a tube projecting through said column and having a hemispherical end portion resting on a cooperating surface of said internal structure,
   means for supporting said tube with respect to said column and for rotating said tube about an orientation axis,
   a specimen holder located in said tube and projecting from said tube,
   and control means connecting said tube and specimen holders and constructed to adjust said specimen holder in position along the three axes of a reference triad,
   wherein said control means comprises annular diaphragm means connecting said specimen holder and tube and located in proximity to the center of said hemispherical surface, manually actuatable linkage means having two sets of push rods and levers for tilting said specimen holder about the center of said diaphragm means into perpendicular directions.

2. A device according to claim 1, wherein said push rods have a high degree of longitudinal stiffness as compared with their resistance to flexure forces.

3. A device according to claim 1, wherein said levers are mounted for rotation on friction bearings exerting a predetermined amount of frictional forces frictional forces.

4. A device according to claim 1, wherein said means for supporting said tube comprise a ball bearing located around said tube and having an inner race fast with said tube.

5. A device according to claim 4, wherein said ball bearing is located in close proximity to the center of gravity of the assembly consisting of said tube and specimen holder.

6. A device according to claim 4 or 5, wherein said ball bearing is supported by said column through a resilient diaphragm having a high degree of radial stiffness.

7. In an electron microscope having a column and an internal structure, a device for adjusting the location and angular position of a specimen holder about an orientation axis, comprising:

a tube projecting through said column and having a hemispherical end portion centered on said axis and resting on a cooperating surface of said internal structure, means for supporting said tube with respect to said column and for rotating said tube about said axis, including a ball bearing located around said tube, having an inner race fast with said tube and having an outer race supported by said column through a resilient annular diaphragm coaxial with said ball bearing and having a high degree of radial stiffness and axial flexibility, a specimen holder located in said tube and projecting from said tube, annular diaphragm means connecting said specimen holder and tube and located in proximity to the center of said hemispherical surface, and manually actuable linkage means having two sets of push rods and levers for tilting said specimen holder about the center of said diaphragm means into perpendicular directions, and having rod means for moving said specimen along said orientation axis, said linkage means being mounted for rotation as a whole with said tube about said orientation axis.

* * * * *